US012621976B2

(12) United States Patent
Hong

(10) Patent No.: US 12,621,976 B2
(45) Date of Patent: May 5, 2026

(54) SRAM CELL STRUCTURE WITH 3 P-CHANNEL TRANSISTORS AND 3 N-CHANNEL TRANSISTORS AND METHOD OF OPERATING THE SRAM CELL

(71) Applicant: Gwangju Institute of Science and Technology, Gwangju (KR)

(72) Inventor: Sung Min Hong, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 167 days.

(21) Appl. No.: 18/625,310

(22) Filed: Apr. 3, 2024

(65) Prior Publication Data
US 2025/0248017 A1 Jul. 31, 2025

(30) Foreign Application Priority Data

Jan. 31, 2024 (KR) ........................ 10-2024-0015264

(51) Int. Cl.
*H10B 10/00* (2023.01)
*G11C 11/412* (2006.01)
(Continued)

(52) U.S. Cl.
CPC ............ *H10B 10/12* (2023.02); *G11C 11/412* (2013.01); *G11C 11/419* (2013.01); *H10D 84/856* (2025.01); *H10D 84/916* (2025.01)

(58) Field of Classification Search
CPC ..... H10B 10/12; G11C 11/412; G11C 11/419; H10D 84/856; H10D 84/916; Y10S 257/903
See application file for complete search history.

(56) References Cited

U.S. PATENT DOCUMENTS 7,336,533 B2 * 2/2008 Hunter .................. G11C 11/412
                                                      365/156
10,790,013 B1 * 9/2020 Dubey .................. G11C 11/412
(Continued)

FOREIGN PATENT DOCUMENTS

KR     20140016187 A     2/2014
KR     20140080475 A     6/2014

OTHER PUBLICATIONS

Liu et al., Ultra-High Density 3D SRAM Cell Designs for Mono-lithic 3D Integration, 2012 IEEE International Interconnect Tech-nology Conference, San Jose, CA, USA, 2012, pp. 1-3.

*Primary Examiner* — Donald HB Braswell
(74) *Attorney, Agent, or Firm* — CANTOR COLBURN LLP

(57) ABSTRACT
Provided is an SRAM cell structure having 3 P-channel transistors and 3 N-channel transistors. The SRAM cell device includes a first inverter composed of a CMOS; a second inverter composed of a CMOS, the input terminal of which is connected to the output terminal of the first inverter, and the output terminal of which is connected to the input terminal of the first inverter; a first access transistor con-nected between the bit line (BL) and the input terminal of the first inverter; and a second access transistor connected in parallel with the first access transistor. The first access transistor is composed of an N-channel transistor and is switched by the WL signal. The second access transistor is composed of a P-channel transistor and is switched by the inverse signal (WWL) of the WRITE signal.

11 Claims, 10 Drawing Sheets

(51) Int. Cl.
   *G11C 11/419*     (2006.01)
   *H10D 84/85*     (2025.01)
   *H10D 84/90*     (2025.01)

(56)        References Cited

U.S. PATENT DOCUMENTS

| | | | |
|---|---|---|---|
| 11,170,844 B1 * | 11/2021 | Doluca | H10B 10/12 |
| 2016/0093365 A1 * | 3/2016 | Song | G11C 11/419 |
| | | | 365/154 |
| 2020/0365601 A1 | 11/2020 | Mann et al. | |
| 2021/0202500 A1 | 7/2021 | Chanemougame et al. | |
| 2024/0257867 A1 * | 8/2024 | You | G11C 11/419 |

* cited by examiner

FIG. 5

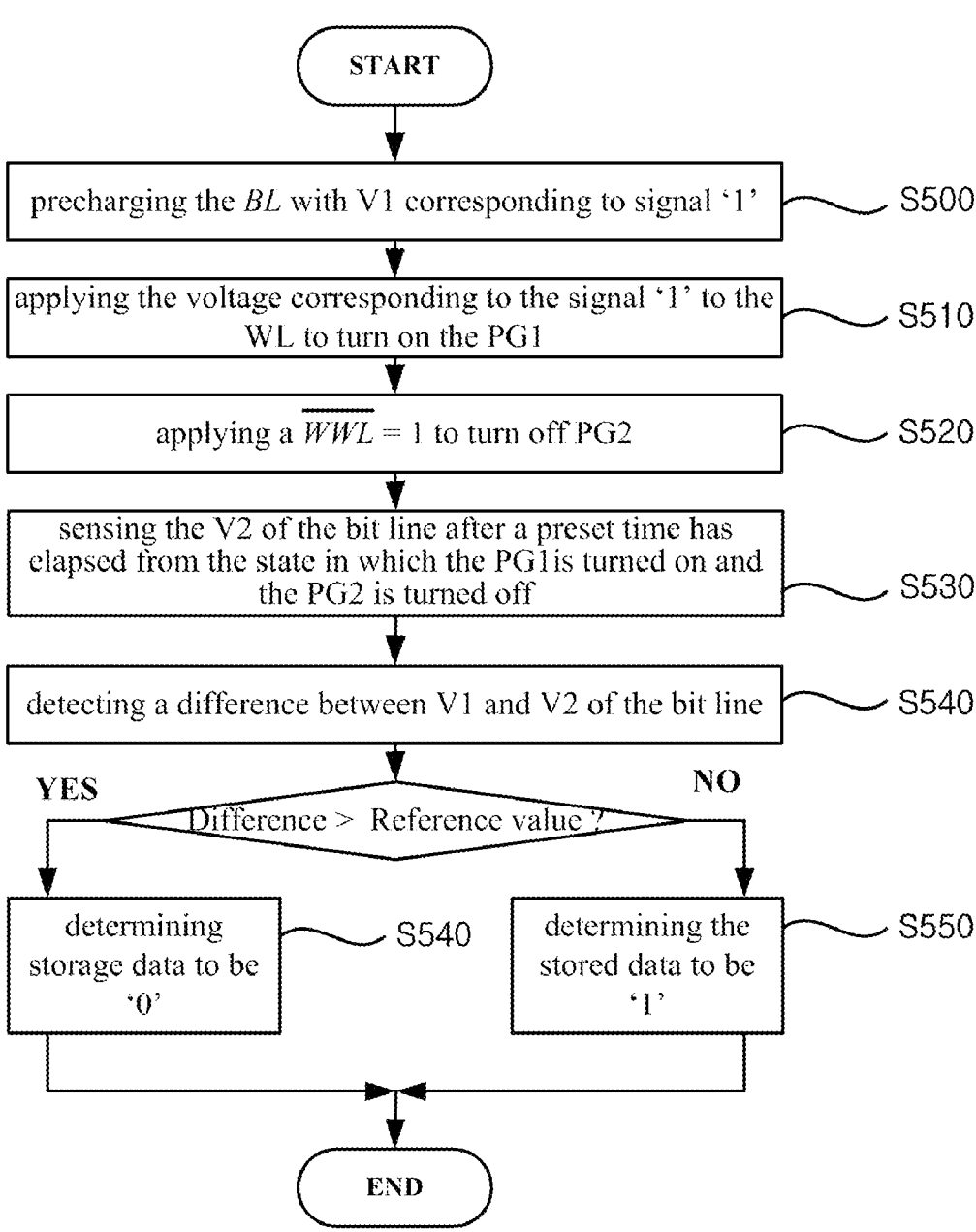

START precharging the *BL* with V1 corresponding to signal '1' — S500 applying the voltage corresponding to the signal '1' to the WL to turn on the PG1 — S510 applying a $\overline{WWL} = 1$ to turn off PG2 — S520 sensing the V2 of the bit line after a preset time has elapsed from the state in which the PG1 is turned on and the PG2 is turned off — S530 detecting a difference between V1 and V2 of the bit line — S540

YES    NO

Difference > Reference value ?

determining storage data to be '0' — S540 determining the stored data to be '1' — S550

END

SRAM CELL STRUCTURE WITH 3 P-CHANNEL TRANSISTORS AND 3 N-CHANNEL TRANSISTORS AND METHOD OF OPERATING THE SRAM CELL

TECHNICAL FIELD

The present invention relates to an SRAM cell structure and a method of operating the SRAM cell. More specifically, the SRAM cell structure according to the present invention consists of three P-transistors and three N-transistors, allowing the application of vertically stacked CFET technology. As a result, according to the present invention, not only can an SRAM cell be manufactured in a smaller area of the silicon, but also the read and write operations can be easily implemented.

BACKGROUND ART

To date, research on scaling of logic semiconductor devices has continued. Recently, attempts have been made to reduce the area of silicon used per a transistor by applying methods reducing the area of standard cells instead of method reducing the line width of channel. However, as these methods also reach their limits, technology for vertically stacked complementary field-effect transistors (hereinafter referred to as 'CFET') has recently been developed. CFET technology is a technology that designs N-type transistors and P-type transistors by vertical stacking. Therefore, CFET technology can manufacture two transistors in the installation area of one transistor, thereby increasing the transistor density of the chip. As a result, by using CFET technology, an area reduction of ideally 50% is possible.

Meanwhile, a Static Random Access Memory (hereinafter referred to as 'SRAM') is a memory with static characteristics that retains information while power is supplied. FIGS. 1A and 1B are circuit diagrams showing a conventional SRAM cell structure. FIG. 1A is a circuit diagram indicated with transistors, and FIG. 1B is a circuit diagram indicated with inverters. As shown in FIGS. 1A and 1B, the SRAM Cell consists of two inverters whose inputs and outputs are interconnected to each other and two access transistors connected to the input and output terminals of the inverters, respectively. The inverter is composed of CMOS composed of N-channel transistor and P-channel transistor. The access transistors are also called the pass-gate transistor and are composed of N-channel transistors. Therefore, the conventional SRAM Cell consists of a total of 6 transistors, that is, 4 N-channel transistors and 2 P-channel transistors.

A word line ((WL) is connected to the gate electrodes of the access transistors, a bit line (BL) is connected to the drain electrode of one access transistor, and a bit line bar ($\overline{BL}$) is connected to the drain electrode of the remaining access transistor.

The aforementioned SRAM can operate faster and more stably than DRAM because the SRAM does not require a refresh operation. Because of these operating characteristics, the SRAM is used in a variety of applications that require high-speed data access, and is especially widely used as a cache memory within the central processing unit of a computer. However, the SRAM Cell consisting of six transistors is not only structurally more complex but also larger in size than the DRAM consisting of one transistor and a capacitor.

Therefore, various efforts have been attempted to improve integration while reducing the size of SRAM. As a method to reduce the size of SRAM, Korean Patent No. 10-1579958 was proposed. The title of the aforementioned patent is "5-transistor SRAM cell". The SRAM cell of the aforementioned patent includes two cross-coupled inverters each having two complementary transistors, and an N-channel transistor switch connected to a bit line and a word line.

Meanwhile, another method of reducing the size of SRAM is to configure the SRAM cell in a two-layer stacked structure by applying the above-described CFET technology. However, since the conventional SRAM cell consists of 4 N-channel transistors and 2 P-channel transistors, the total area of the SRAM cell is determined by the area of the layer where the 4 N-channel transistors are formed. Therefore, this method has the problem of not significantly improving the overall integration.

Meanwhile, Chang Liu and Sung Kyu Lim presented a paper titled "Ultra-High Density 3D SRAM Cell Designs for Monolithic 3D Integration". In this paper, the access transistors are composed of NMOSFET and PMOSFET. As a result, the SRAM Cell consists of 3 N-channel transistors and 3 P-channel transistors.

FIGS. 2A and 2B are circuit diagrams showing read and write operations respectively in the 3P3N 3D SRAM Cell structure presented in the paper by Chang Liu and Sung Kyu Lim. Referring to FIGS. 2A and 2B, in this structure, the gate overdrive voltage of the NMOSFET (M5), which is an access transistor, is lowered when the voltage of Q is slightly greater than 0 Volt. Accordingly, Q cannot be charged. Therefore, it is difficult to write $V_{DD}$ to Q. Also, when writing $V_{DD}$ to Q, $\overline{Q}$ should be 0 Volt. However, PMOSFET (M6), which is an access transistor, also loses its discharge ability when $\overline{Q}$ becomes even slightly smaller than $V_{DD}$. Therefore, the SRAM Cell with the above-described structure has difficulty in the write operation.

As such, the SRAM Cell according to the above-mentioned paper is not easy to perform the write operation, and a problem arises that requires additional techniques to assist the write operation.

SUMMARY OF THE INVENTION

An object of the present invention to solve the above problems is to provide an SRAM cell structure composed of the same number of PMOSFETs and NMOSFETs, so that the cell area can be minimized by manufacturing it using CFET technology.

In order to achieve the above-described technical problem, the SRAM cell structure according to the first aspect of the present invention is characterized by comprising; a first inverter composed of a CMOS; a second inverter composed of a CMOS, the input terminal of which is connected to the output terminal of the first inverter, and the output terminal of which is connected to the input terminal of the first inverter; a first access transistor connected between the bit line (BL) and the input terminal of the first inverter; and a second access transistor connected between the bit line (BL) and the input terminal of the first inverter, and connected in parallel with the first access transistor, wherein the first access transistor is composed of an N-channel transistor and the second access transistor is composed of a P-channel transistor.

In the SRAM cell structure having 3 P-channel transistors and 3 N-channel transistors according to the first aspect of the present invention descried above, it is preferable that the gate electrode of the first access transistor is connected to a word line (WL) and the first access transistor is switched by the WL signal, and the inverse signal ($\overline{WWL}$) of the WRITE signal (WWL) is input to the gate electrode of the second access transistor and the second access transistor is switched by the $\overline{WWL}$ signal.

In the SRAM cell structure having 3 P-channel transistors and 3 N-channel transistors according to the first aspect of the present invention descried above, it is preferable that the N-channel transistor of the second inverter is composed of an element having a driving capability greater than that of the first access transistor.

In the SRAM cell structure having 3 P-channel transistors and 3 N-channel transistors according to the first aspect of the present invention descried above, it is preferable that the N-channel transistor of the second inverter is composed of an element having a driving capability smaller than the sum of the driving capabilities of the first and second access transistors.

In the SRAM cell structure having 3 P-channel transistors and 3 N-channel transistors according to the first aspect of the present invention descried above, it is preferable that the P-channel transistor of the second inverter is composed of an element having a driving capability smaller than the sum of the driving capabilities of the first and second access transistors.

In the SRAM cell structure having 3 P-channel transistors and 3 N-channel transistors according to the first aspect of the present invention descried above, it is preferable that the SRAM cell structure is manufactured in a vertically stacked form using vertically stacked complementary field-effect transistor (CFET) technology, and transistors with the same type of channel in the SRAM cell are formed in one layer.

A method of operating an SRAM cell structure according to a second aspect of the present invention is characterized by including a read operation method comprising the following steps: (a1) precharging the bit line (BL) with a first voltage corresponding to signal '1'; (a2) applying the voltage corresponding to the signal '1' to the word line (WL) connected to a gate electrode of a first access transistor to turn on the first access transistor; (a3) applying a voltage corresponding to the inverse signal ($\overline{WWL}$) of the WRITE signal (WWL=0) to the gate electrode of the second access transistor to turn off the second access transistor; (a4) sensing the second voltage of the bit line after a preset time has elapsed from the state in which the first access transistor is turned on and the second access transistor is turned off; (a5) detecting a difference between the first voltage and the second voltage of the bit line; and (a6) Determining storage data of the SRAM cell to be '0' if the detected difference of the bit line is greater than a preset reference value, otherwise, determining the stored data of the SRAM cell to be '1'.

In the method of operating the SRAM cell structure according to the second aspect of the present invention descried above, it is preferable that the method further includes a write operation method comprising the following steps: (b1) applying the voltage corresponding to the signal '1' to the word line connected to the gate electrode of the first access transistor to turn on the first access transistor; (b2) applying a voltage corresponding to the inverse signal ($\overline{WWL}$) of the WRITE signal (WWL=1) to the gate electrode of the second access transistor to turn on the second access transistor; and (b3) applying a voltage corresponding to a signal intended to be stored in the SRAM cell to the bit line and turning off the first and second access transistors after a preset time has elapsed.

The SRAM Cell according to the present invention having the above-described configuration is composed of the same number of PMOSFETs and NMOSFETs, and can be manufactured using the CFET technology to minimize the area of the cell.

In addition, the SRAM Cell according to the present invention is composed of a two-layer stacked structure, and the same number of PMOSFETs and NMOSFETs are placed in each layer, so that the efficiency in device area can be maximized.

In addition, the SRAM Cell according to the present invention consists of access transistors as a pair of NMOS-FET and PMOSFET, and the PMOSFET is configured to be switched by the inverse signal ($\overline{WWL}$) of the WRITE signal (WWL). The conventional 6T SRAM cell can perform read and write operations using a BL signal and a $\overline{BL}$ signal. However, the SRAM Cell according to the present invention is capable of read and write operations using only the BL signal.

In addition, the SRAM Cell according to the present invention sets the driving capability conditions of each transistor constituting the SRM cell to ensure stable read and write operations. Furthermore, by being designed with transistors that satisfy these driving capability conditions, the SRAM Cell according to the present invention can stably perform the read and write operations.

BRIEF DESCRIPTION OF THE DRAWINGS

FIG. 1A is a circuit diagram indicated with transistors, and FIG. 1B is a circuit diagram indicated with inverters.

FIG. 3A is a circuit diagram indicated with inverters and FIG. 3B is a circuit diagram indicated with translators.

FIG. 5 is a flowchart sequentially explaining the read operation in the SRAM cell according to the preferred embodiment of the present invention.

DETAILED DESCRIPTION

Hereinafter, with reference to the attached drawings, the SRAM cell structure with 3 P-channel transistors and 3 N-channel transistors and the operating method in the SRAM cell structure according to a preferred embodiment of the present invention will be described in detail.

Figure 1A:
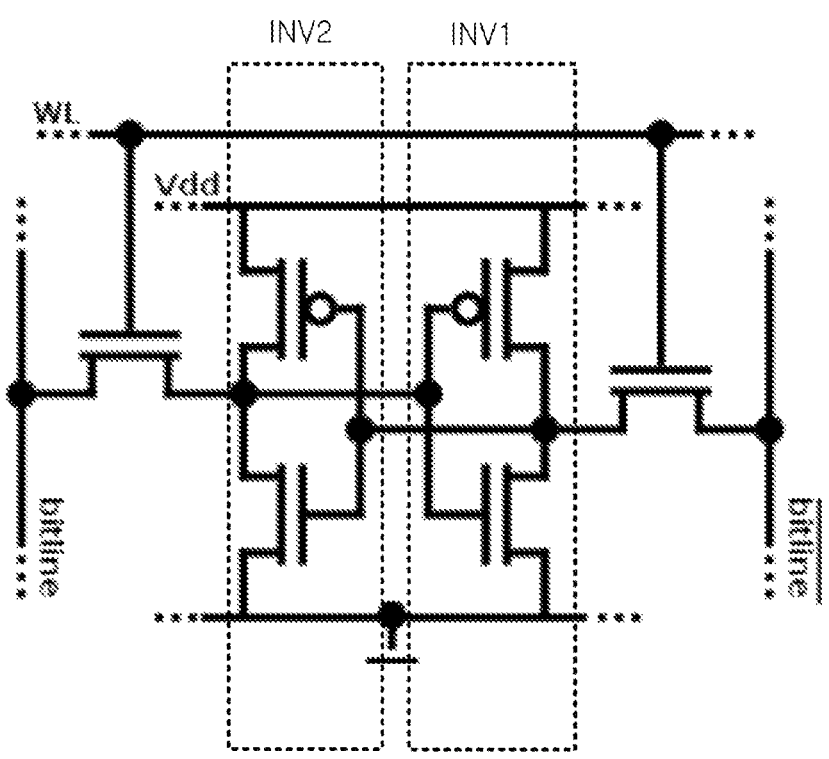
FIGS. 1A and 1B are circuit diagrams showing a conventional SRAM cell structure.
Figure 1B:
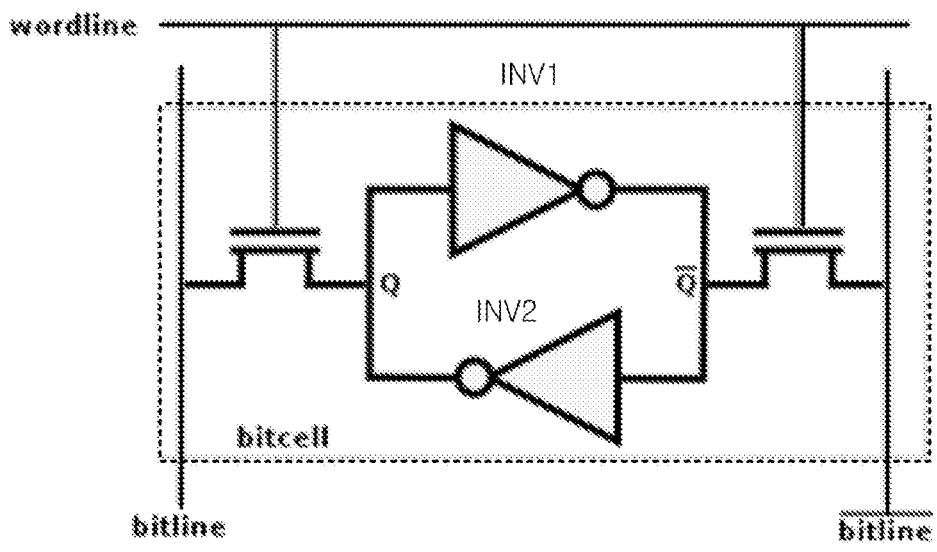
Figure 2A:
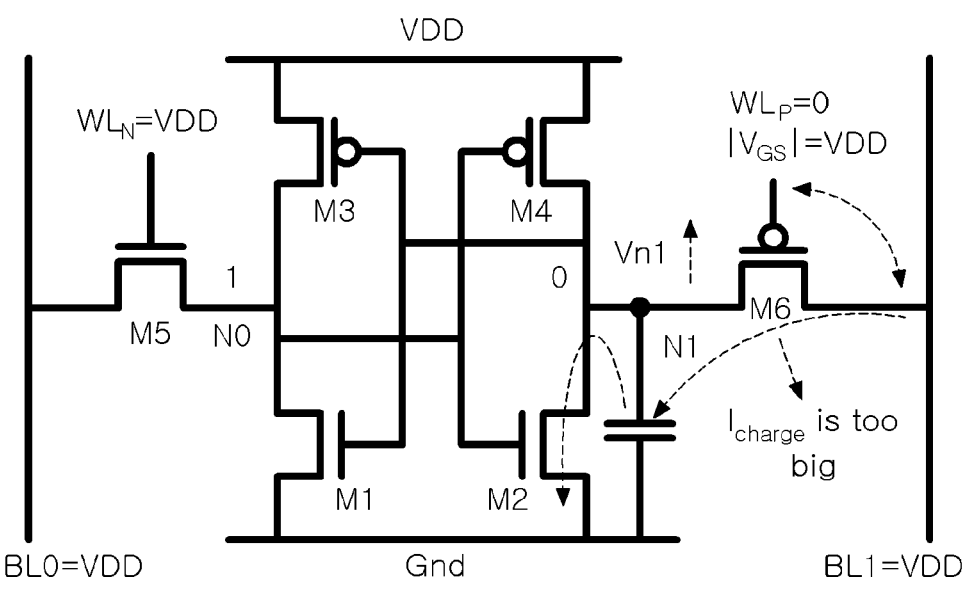
FIGS. 2A and 2B are circuit diagrams showing read and write operations in the 3P3N 3D SRAM Cell structure presented in the paper by Chang Liu and Sung Kyu Lim.
Figure 2B:
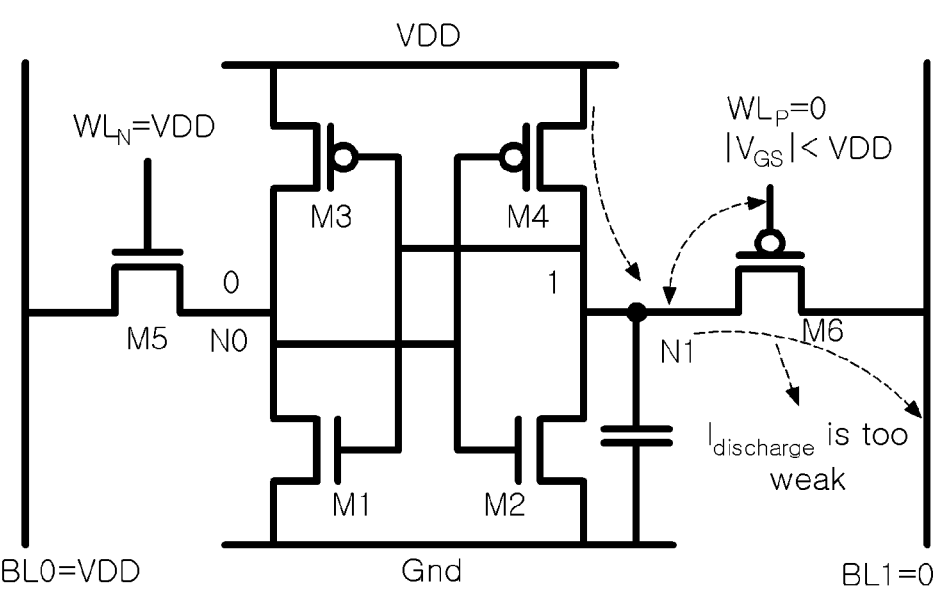
Figure 3A:
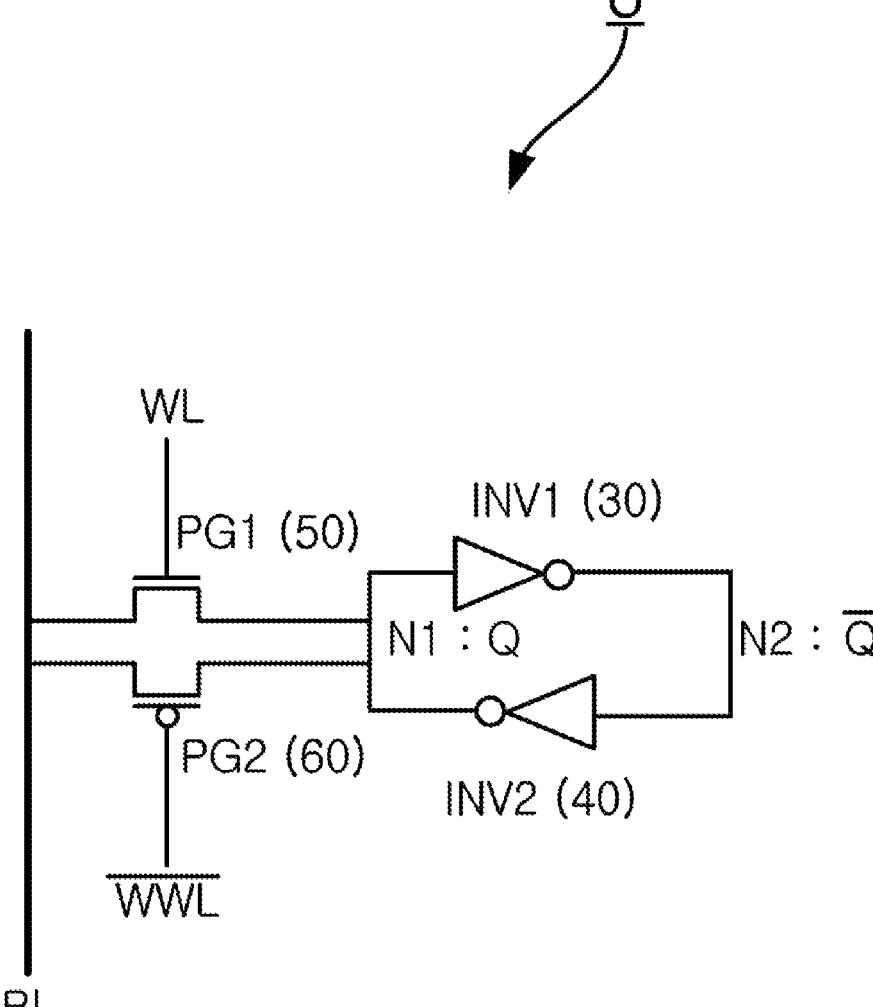
FIGS. 3A and 3B are circuit diagrams showing the SRAM cell structure according to a preferred embodiment of the present invention.
Figure 3B:
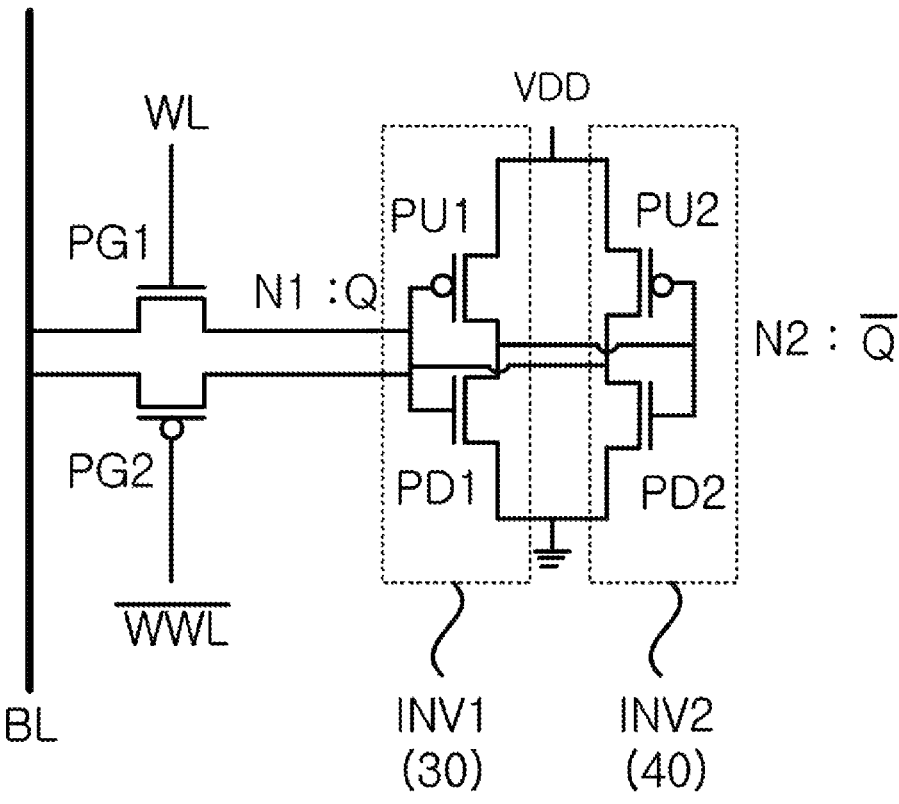

FIGS. 3A and 3B are circuit diagrams showing the SRAM cell structure according to a preferred embodiment of the present invention. FIG. 3A is a circuit diagram indicated with inverters, and FIG. 3B is a circuit diagram indicated with transistors. Referring to FIGS. 3A and 3B, the SRAM cell structure 3 according to the present invention includes a first inverter 30 and a second inverter 40 whose inputs and outputs are interconnected to each other, a first access transistor 50, and a second access transistor 60.

The first inverter 30 is composed of a CMOS in which a P-channel transistor (PUT) and an N-channel transistor (PD1) are connected to each other.

The second inverter 40 is composed of a CMOS in which a P-channel transistor (PU2) and an N-channel transistor (PD2) are connected to each other. The input terminal of the second inverter is connected to the output terminal of the first inverter, and the output terminal of the second inverter is connected to the input terminal of the first inverter.

The first access transistor (PG1: 50) is composed of an N-channel transistor and is connected between the bit line (BL) and the input terminal of the first inverter, and the gate electrode of the first access transistor is connected to the word line (WL). Accordingly, the first access transistor (PG1:50) can be switched by the signal of the WL.

The second access transistor (PG2: 60) is composed of a P-channel transistor, is connected between the bit line and the input terminal of the first inverter, and is connected in parallel with the first access transistor. The reverse signal ($\overline{\text{WWL}}$) of the WRITE signal (WWL) is input to the gate electrode of the second access transistor 60. Accordingly, the second access transistor 60 can be switched by the $\overline{\text{WWL}}$ signal. In a read operation, WRITE signal (WWL) is set to 0 and in a write operation, WRITE signal (WWL) is set to 1. Accordingly, in a read operation, WWL=0 and $\overline{\text{WWL}}$=1, and in a write operation, WWL=1 and $\overline{\text{WWL}}$=0. The P-channel transistor and N-channel transistor may be configured as MOSFETs.

The SRAM cell structure is manufactured in a vertically stacked manner using vertically stacked complementary field-effect transistor (CFET) technology, and transistors with the same type of channel of the SRAM cell are preferably formed in one layer. Therefore, in the SRAM cell according to the present invention, it is desirable that the P-channel transistor PU1 of the first inverter, the P-channel transistor PU2 of the second inverter, and the second access transistor 60 composed of the P-channel transistor are manufactured in one layer, and the N-channel transistor (PD1) of the first inverter, the N-channel transistor (PD2) of the second inverter, and the first access transistor 50 composed of the N-channel transistor are manufactured on another layer stacked in the vertical direction.

As described above, the SRAM cell structure according to the present invention is composed of the same number of P-channel transistors and N-channel transistors. Therefore, when manufactured in a vertically stacked manner using CFET technology, the SRAM cell structure according to the present invention can minimize the cell area.

In the SRAM cell structure according to the present invention, in order to ensure that read operation and write operation are performed stably, the driving capability of each transistor of the SRAM cell must satisfy the following conditions. Here, the driving capability of a transistor refers to the maximum drain current ($I_D$) that can flow in the transistor, and is proportional to the Width/Length ratio of the transistor's channel.

$$\text{Driving capability of } PD2 > \text{Driving capability of } PG1 \qquad 1)$$

$$(\text{Driving capability of } PG1 + \text{Driving capability of } PG2) > \qquad 2)$$
$$\text{Driving capability of } PD2$$

$$(\text{Driving capability of } PG1 + \text{Driving capability of } PG2) > \qquad 3)$$
$$\text{Driving capability of } PU2$$

In the method of operating the SRAM cell according to the present invention, which will be described later, the conditions for driving capability of each transistor described above will be described in more detail.

Figure 4:
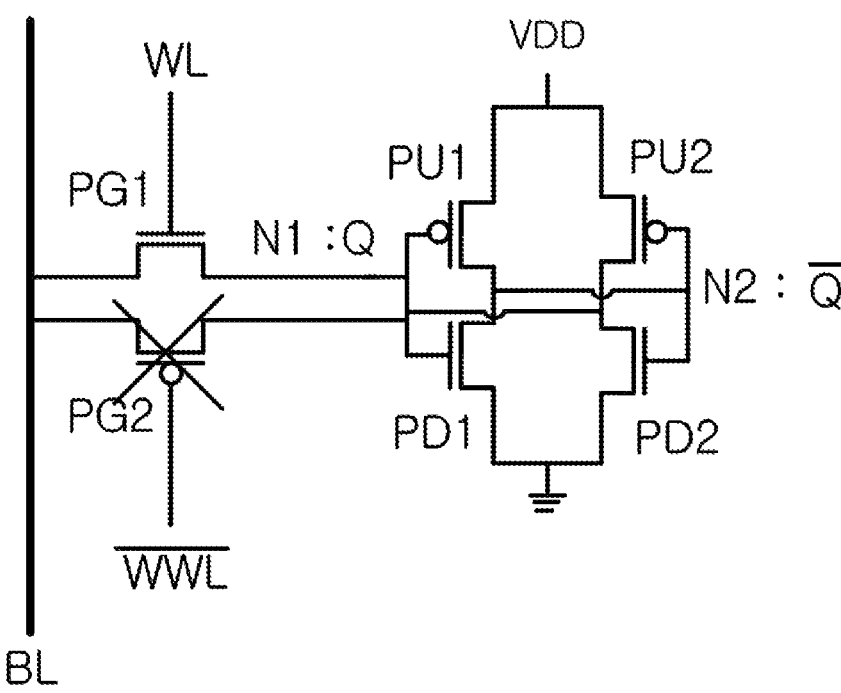
FIG. 4 is a circuit diagram illustrating the read operation in the SRAM cell according to a preferred embodiment of the present invention.

Hereinafter, the read operation of the SRAM cell according to the preferred embodiment of the present invention described above will be described in detail. FIG. 4 is a circuit diagram illustrating the read operation in the SRAM cell according to the preferred embodiment of the present invention. And, FIG. 5 is a flowchart sequentially explaining the read operation in the SRAM cell according to the preferred embodiment of the present invention.

Referring to FIGS. 4 and 5, for the read operation in the SRAM cell according to the present invention, at first, a WRITE signal (WWL) is set to '0' and the bit line (BL) is precharged with the first voltage (V1) corresponding to the signal '1' (Step 500). Next, the voltage corresponding to the signal '1' is applied to the word line (WL) connected to the gate electrode of the first access transistor to turn on the first access transistor (PGT) (step 510). Next, a voltage corresponding to the inverse signal ($\overline{\text{WWL}}$) of the WRITE signal (WWL=0) is applied to the gate electrode of the second access transistor to turn off the second access transistor (PG2) composed of a P-channel transistor (Step 520). Here, since it is a read operation, the WRITE signal (WWL) is set to 0, so WWL=0 and $\overline{\text{WWL}}$=1. Next, the second voltage V2 of the bit line is sensed after a preset time has elapsed from the state in which the first access transistor is turned on and the second access transistor is turned off (step 530). Next, the difference ($V_{diff}$) between the precharged first voltage (V1) and the sensed second voltage (V2) of the bit line is detected (step 540). Next, if the detected difference ($V_{diff}$) of the bit line is greater than the preset reference value, the stored data of the SRAM cell is determined as '0', otherwise, the stored data of the SRAM cell is determined as '1' (Step 550).

Hereinafter, the read operation mechanism when Q is '0' will be briefly described.

When Q=0, the node N1 is 0, so PU1 is in ON state and PD1 is OFF state, and the node N2 is 1, so PU2 is in OFF state and PD2 is ON state. In this state, the bit line is precharged with the first voltage corresponding to the signal '1' and PG1 is turned on. As a result, a voltage difference occurs between the bit line (BL) and the node N1, and current flow occurs from the bit line (BL) to the node N1. At this time, since the driving capability of PD2 is greater than that of PG1, the current is discharged from the bit line (BL) to PD2 through PG1 as time passes. As a result, the second voltage of the bit line (BL) detected after a certain period of time is reduced than the precharged first voltage of the bit line (BL). Therefore, if the first voltage precharged in the BL is greater than the second voltage after time has elapsed, the information stored in the SRAM cell is determined to be '0'.

Next, the mechanism of the read operation when Q is '1' will be briefly explained. When Q=1, the node N1 is 1, so PU1 is in OFF state and PD1 is ON state, and the node N2 is 0, so PU2 is in ON state and PD2 is OFF state. In this state, the bit line is precharged with the first voltage corresponding to the signal '1' and PG1 is turned on. However, even if the bit line (BL) is precharged with the signal '1' and PG1 is turned on, there is no voltage difference between the bit line (BL) and the node N1, and there is no current flow from the bit line to the node N1. Therefore, the precharged first voltage of the bit line (BL) remains the same. Therefore, if the first voltage precharged in the BL is the same as the second voltage after time has elapsed, the information stored in the SRAM cell is determined to be '1'.

Figure 6:
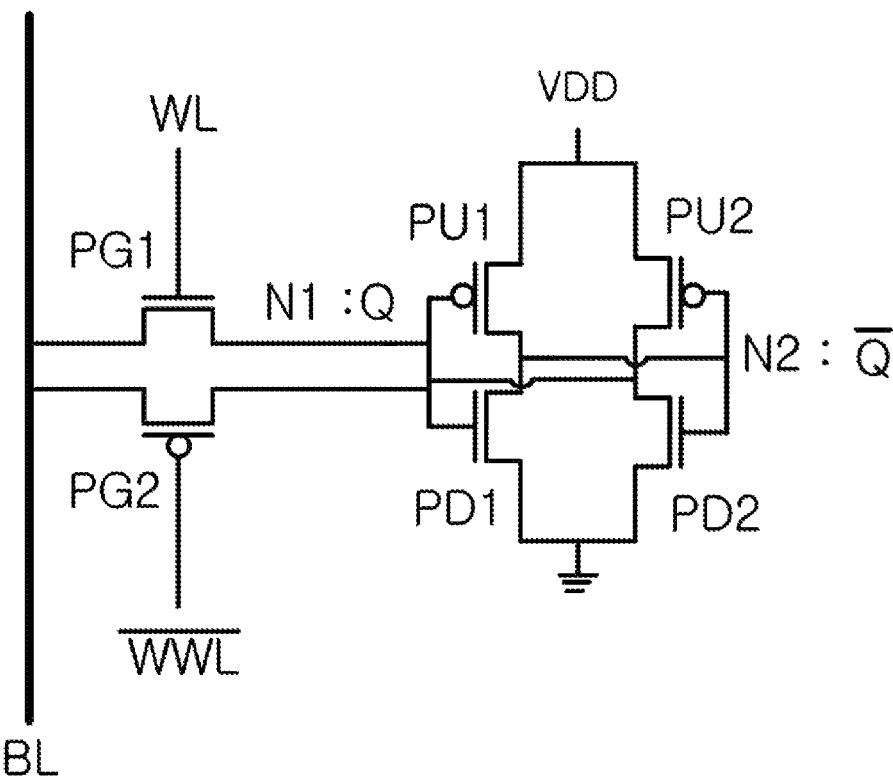
FIG. 6 is a circuit diagram illustrating the write operation in the SRAM cell according to a preferred embodiment of the present invention.

Hereinafter, a write operation of the SRAM cell according to a preferred embodiment of the present invention described above will be described in detail. FIG. 6 is a circuit diagram illustrating the write operation in the SRAM cell according to the preferred embodiment of the present invention. And, FIG. 7 is a flowchart sequentially explaining the write operation in the SRAM cell according to the preferred embodiment of the present invention.

Figure 7:
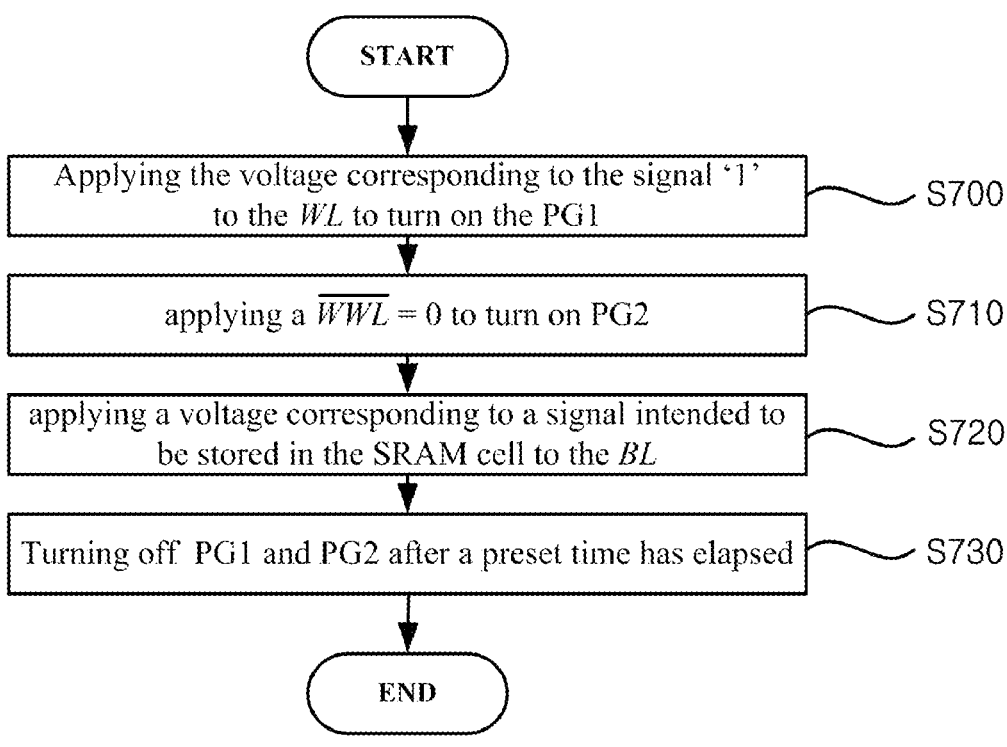
FIG. 7 is a flowchart sequentially explaining the write operation in the SRAM cell according to a preferred embodiment of the present invention.

Referring to FIGS. 6 and 7, for the write operation in the SRAM cell according to the present invention, a WRITE signal (WWL) is set to '1'. Next, the voltage corresponding to the signal '1' is applied to the word line connected to the gate electrode of the first access transistor (PG1) to switch on the first access transistor (PG1) (step 700). Then, a voltage corresponding to the inverse signal ($\overline{WWL}$) of the WRITE signal (WWL=1) is applied to the gate electrode of the second access transistor to turn on the second access transistor (step 710). Here, since it is a write operation, the WRITE signal (WWL) is set to '1', so WWL=1 and $\overline{WRITE}$=0.

Then, a voltage corresponding to the signal intended to be stored in the SRAM cell is applied to the bit line (step 720). The above-described steps 700, 710, and 720 may be performed simultaneously, or their order may be changed as needed.

Next, data is stored in the SRAM cell by turning off the first and second access transistors after a preset time has elapsed (step 730).

Hereinafter, the write operation mechanism when the data intended to be stored is '0' will be briefly described.

First, we will explain the operation of writing a signal '0' to the SRAM cell when Q=0 has already been stored. When Q=0, the node N1 is 0, so PU1 is in ON state and PD1 is OFF state, and the node N2 is 1, so PU2 is in OFF state and PD2 is ON state. In this state, the voltage corresponding to the signal '0' intended to be stored is applied to the BL. There is no potential difference between the BL and the node N1, and as a result, there is no current flow from the bit line to the node N1. As a result, Q remains at 0.

Next, the operation of writing a signal '0' to the SRAM cell when Q=1 is already stored is explained. When Q=1, the node N1 is 1, so PU1 is in OFF state and PD1 is ON state, and the node N2 is 0, so PU2 is in ON state and PD2 is OFF state. In this state, the voltage corresponding to the signal '0' intended to be stored is applied to the BL. At this time, according to the device design condition {(Driving capability of PG1+Driving capability of PG2)>Driving capability of PD2}, PG1 and PG2 change the voltage of Q to '0'.

Hereinafter, the write operation mechanism when the data intended to be stored is '1' will be briefly described.

First, we will explain the operation of writing the signal '1' to the SRAM cell when Q=0 has already been stored. When Q=0, the node N1 is 0, so PU1 is in ON state and PD1 is OFF state, and the node N2 is 1, so PU2 is in OFF state and PD2 is ON state. In this state, the voltage corresponding to the signal '1' intended to be stored is applied to the BL. At this time, according to the device design condition {(Driving capability of PG1+Driving capability of PG2) >Driving capability of PU2}, PG1 and PG2 change the voltage of Q to '$V_{DD}$'.

Next, the operation of writing the signal '1' to the SRAM cell when Q=1 is already stored is explained. When Q=1, the node N1 is 1, so PU1 is in OFF state and PD1 is ON state, and the node N2 is 0, so PU2 is in ON state and PD2 is OFF state. In this state, the voltage corresponding to the signal '1' intended to be stored is applied to the BL. Since both the BL and the node N1 are '0', there is no voltage difference between the BL and the node N1, and as a result, there is no current flow from the bit line to the node N1. As a result, Q maintains the signal '1'.

In the above, the present invention has been mainly described with respect to preferred embodiments thereof, but this is merely an example and does not limit the present invention. Those of ordinary skill in the art to which the present invention pertains will appreciate that various modifications and applications not exemplified above are possible without departing from the essential features of the present invention. And, the differences related to these modifications and applications should be interpreted as being included in the scope of the present invention defined in the appended claims.

What is claimed is:

1. An SRAM cell structure with 3 P-channel transistors and 3 N-channel transistors, the SRAM cell structure comprising;

a first inverter composed of a CMOS;

a second inverter composed of a CMOS, an input terminal of which is connected to an output terminal of the first inverter, and an output terminal of which is connected to an input terminal of the first inverter;

a first access transistor connected between bit line (BL) and the input terminal of the first inverter; and a second access transistor connected between the bit line (BL) and the input terminal of the first inverter and connected in parallel with the first access transistor;

wherein the first access transistor is composed of an N-channel transistor and the second access transistor is composed of a P-channel transistor, wherein a gate electrode of the first access transistor is connected to a word line (WL) and the first access transistor is switched by a signal of the WL, and wherein an inverse signal ($\overline{WWL}$) of a WRITE signal (WWL) is input to a gate electrode of the second access transistor and the second access transistor is switched by the inverse signal $\overline{WWL}$.

2. The SRAM cell structure with 3 P-channel transistors and 3 N-channel transistors of claim 1, wherein an N-channel transistor of the second inverter is composed of an element having a driving capability greater than that of the first access transistor.

3. The SRAM cell structure with 3 P-channel transistors and 3 N-channel transistors of claim 1, wherein an N-channel transistor of the second inverter is composed of an element having a driving capability smaller than the sum of the driving capabilities of the first and second access transistors.

4. The SRAM cell structure with 3 P-channel transistors and 3 N-channel transistors of claim 2, wherein the driving capability of a transistor is a maximum drain current ($I_D$) that can flow in the transistor.

5. The SRAM cell structure with 3 P-channel transistors and 3 N-channel transistors of claim 1, wherein a P-channel transistor of the second inverter is composed of an element having a driving capability smaller than the sum of the driving capabilities of the first and second access transistors.

6. The SRAM cell structure with 3 P-channel transistors and 3 N-channel transistors of claim 3, wherein the driving capability of a transistor is a maximum drain current ($I_D$) that can flow in the transistor.

7. The SRAM cell structure with 3 P-channel transistors and 3 N-channel transistors of claim 5, wherein the driving capability of a transistor is a maximum drain current ($I_D$) that can flow in the transistor.

8. The SRAM cell structure with 3 P-channel transistors and 3 N-channel transistors of claim 1, wherein the SRAM cell structure is manufactured in a vertically stacked form using vertically stacked complementary field-effect transistor (CFET) technology, and transistors with the same type of channel in the SRAM cell are placed in one layer.

9. A method of operating a SRAM cell structure comprising a first inverter composed of a CMOS, a second inverter composed of a CMOS, a first access transistor composed of an N-channel transistor and connected between a bit line (BL) and the input terminal of the first inverter, and a second access transistor composed of a P-channel transistor and connected in parallel with the first access transistor, the method comprising the following steps for a read operation:

(a1) precharging the bit line (BL) with a first voltage corresponding to signal '1' and setting a WRITE signal (WWL) to '0';

(a2) applying the voltage corresponding to the signal '1' to a word line (WL) connected to a gate electrode of the first access transistor to turn on the first access transistor;

(a3) applying a voltage corresponding to the inverse signal ($\overline{\text{WWL}}$) of the WRITE signal (WWL=0) to a gate electrode of the second access transistor to turn off the second access transistor;

(a4) sensing a second voltage of the bit line after a preset time has elapsed from the state in which the first access transistor is turned on and the second access transistor is turned off;

(a5) detecting a difference between the first voltage and the second voltage of the bit line; and (a6) determining the stored data of the SRAM cell according to the detected difference of the bit line.

10. The method of operating the SRAM cell structure according to claim 9, further comprising the following steps for a write operation:

(b1) setting the WRITE signal (WWL) to '1';

(b2) applying the voltage corresponding to the signal '1' to the word line connected to the gate electrode of the first access transistor to turn on the first access transistor;

(b3) applying the voltage corresponding to the inverse signal ($\overline{\text{WWL}}$) of the WRITE signal (WWL=1) to the gate electrode of the second access transistor to turn on the second access transistor; and (b4) applying a voltage corresponding to a signal intended to be stored in the SRAM cell to the bit line and turning off the first and second access transistors after a preset time has elapsed.

11. The method of operating the SRAM cell structure according to claim 9, wherein in the step (a6), if the detected difference of the bit line is greater than a preset reference value, determining the stored data of the SRAM cell to be '0', otherwise, determining the stored data of the SRAM cell to be '1'.

* * * * *